United States Patent
Sauder et al.

(10) Patent No.: US 12,420,542 B2
(45) Date of Patent: Sep. 23, 2025

(54) DOCTOR

(71) Applicant: TKM Meyer GmbH, Bargteheide (DE)

(72) Inventors: Christian Sauder, Wuppertal (DE); Thomas Störte, Bargteheide (DE)

(73) Assignee: TKM MEYER GMBH, Bargteheide (DE)

( * ) Notice: Subject to any disclaimer, the term of this patent is extended or adjusted under 35 U.S.C. 154(b) by 0 days.

(21) Appl. No.: 18/035,128

(22) PCT Filed: Feb. 10, 2022

(86) PCT No.: PCT/DE2022/100115
§ 371 (c)(1),
(2) Date: May 3, 2023

(87) PCT Pub. No.: WO2022/171251
PCT Pub. Date: Aug. 18, 2022

(65) Prior Publication Data
US 2024/0009989 A1    Jan. 11, 2024

(30) Foreign Application Priority Data
Feb. 12, 2021  (DE) ............. 10 2021 103 315.2

(51) Int. Cl.
*B41F 9/10*   (2006.01)

(52) U.S. Cl.
CPC ................. *B41F 9/1072* (2013.01)

(58) Field of Classification Search
CPC .................................................... B41F 9/1072
See application file for complete search history.

(56) References Cited

U.S. PATENT DOCUMENTS

| | | | |
|---|---|---|---|
| 4,055,119 A | 10/1977 | Mitter | |
| 5,101,725 A * | 4/1992 | Kobler | B41F 9/1072 101/169 |
| 5,242,498 A * | 9/1993 | Kohler | B05C 11/041 118/123 |
| 5,638,751 A * | 6/1997 | Daetwyler | B41F 9/1072 101/169 |

(Continued)

FOREIGN PATENT DOCUMENTS

| | | |
|---|---|---|
| AT | 349423 B | 4/1979 |
| DE | 19512696 A1 | 4/1996 |

(Continued)

OTHER PUBLICATIONS

Machine Translation of AT 349423 to Zimmer (Year: 1978).*

*Primary Examiner* — David H Banh
(74) *Attorney, Agent, or Firm* — McGlew and Tuttle, P.C.

(57) ABSTRACT

A doctor (20), in particular for printing cylinders and coating systems, includes a doctor edge (21), a doctor body (22), and a curved blade profile (25) which is formed between the doctor edge (21) and the doctor body (22). In order to produce a doctor (20) which reduces the maintenance requirements of a gravure, flexographic, offset and/or digital printing machine and increases the service life of a doctor (20), according to the invention the extension of the curved blade profile (25) from the doctor edge (21) to the doctor body (22) is square or cuboid and/or the extension of the curved blade profile (25) from the doctor edge (21) to the doctor body (22) has at least one turning point (26).

10 Claims, 10 Drawing Sheets

(56) References Cited

U.S. PATENT DOCUMENTS

| | | | |
|---|---|---|---|
| 5,685,221 A | 11/1997 | Newman | |
| 2008/0127495 A1* | 6/2008 | Fantoni | B05C 11/045 |
| | | | 30/169 |
| 2008/0257184 A1* | 10/2008 | Storte | B05C 1/0817 |
| | | | 101/425 |
| 2009/0120355 A1 | 5/2009 | Urata et al. | |
| 2011/0219968 A1* | 9/2011 | Fogh-Hansen | B41F 31/027 |
| | | | 101/157 |
| 2014/0174311 A1* | 6/2014 | Lunnerfjord | B41F 9/10 |
| | | | 101/157 |
| 2014/0261033 A1* | 9/2014 | Fogh-Hansen | B41F 31/04 |
| | | | 277/549 |

FOREIGN PATENT DOCUMENTS

| | | |
|---|---|---|
| DE | 10120117 A1 | 12/2001 |
| DE | 69527829 T2 | 12/2002 |
| DE | 60120483 T2 | 6/2007 |
| EP | 0061093 A1 | 9/1982 |
| EP | 1930160 A1 | 6/2008 |
| FR | 2707918 A1 | 1/1995 |
| WO | 9206796 A1 | 4/1992 |

* cited by examiner

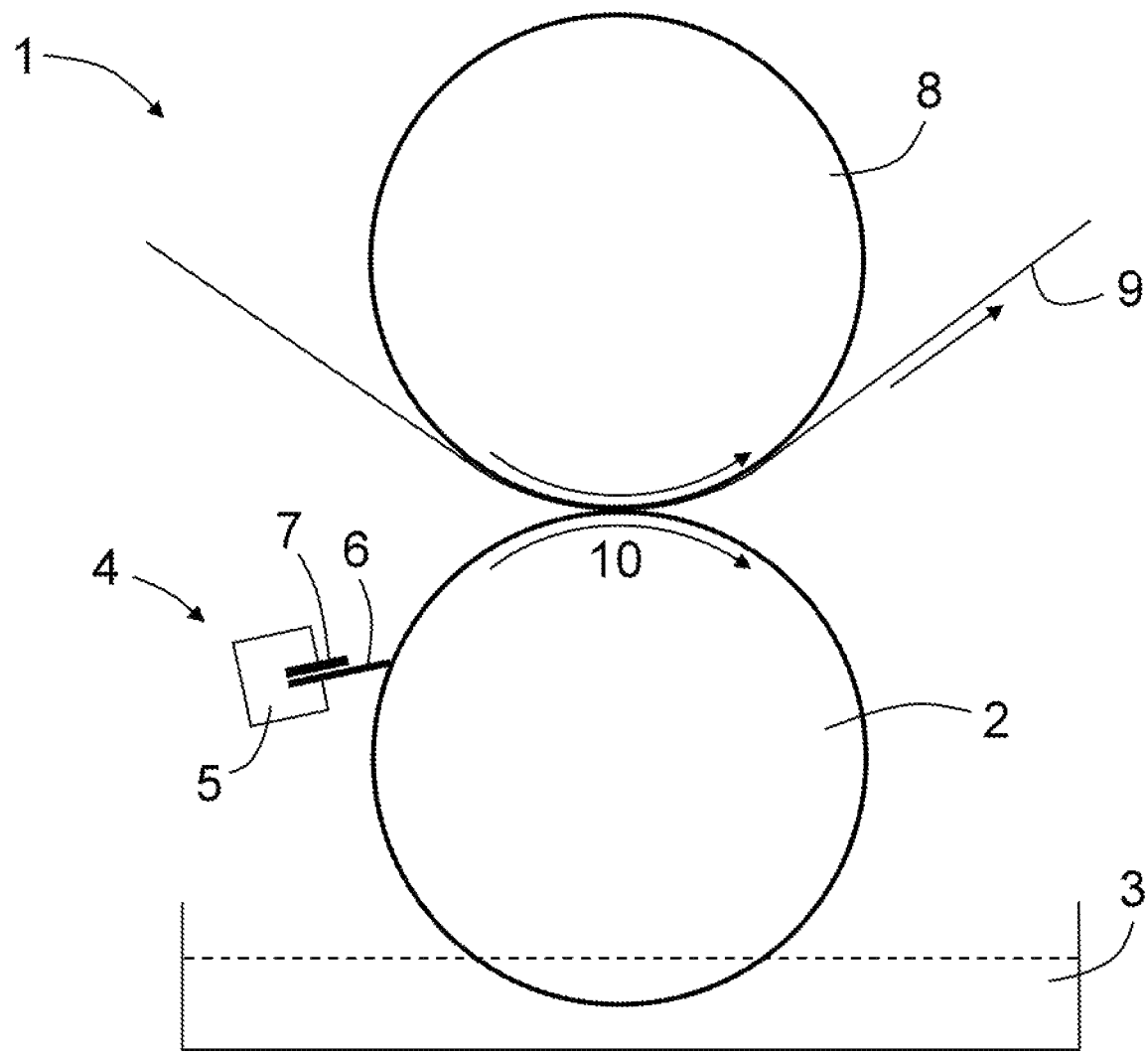
Fig. 1a (State of the Art)

Fig. 1b (State of the Art)
a)
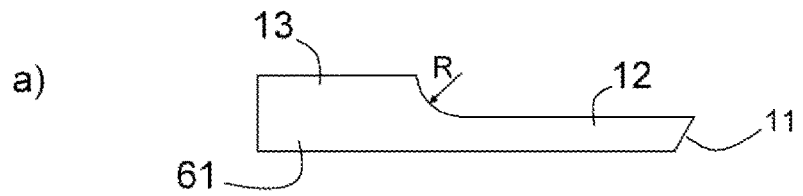
b)
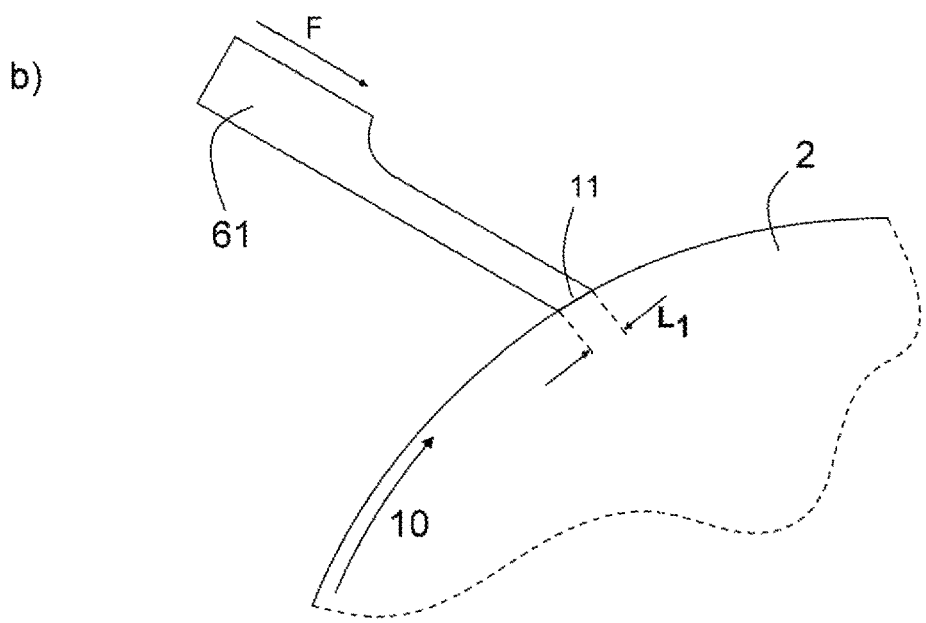
c)
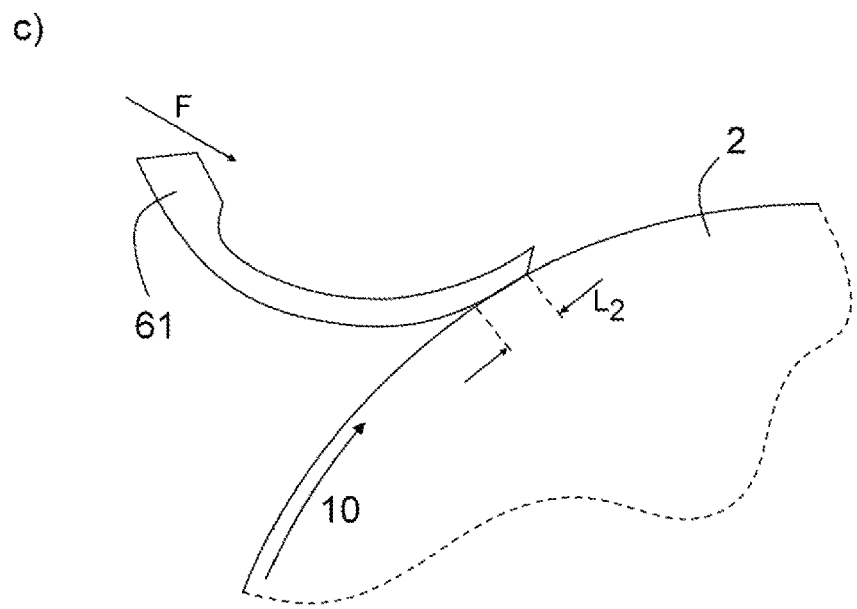

Fig. 1c (State of the Art)
a)
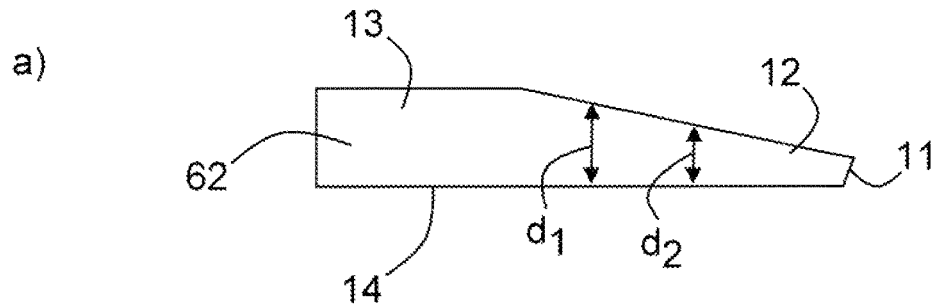
b)
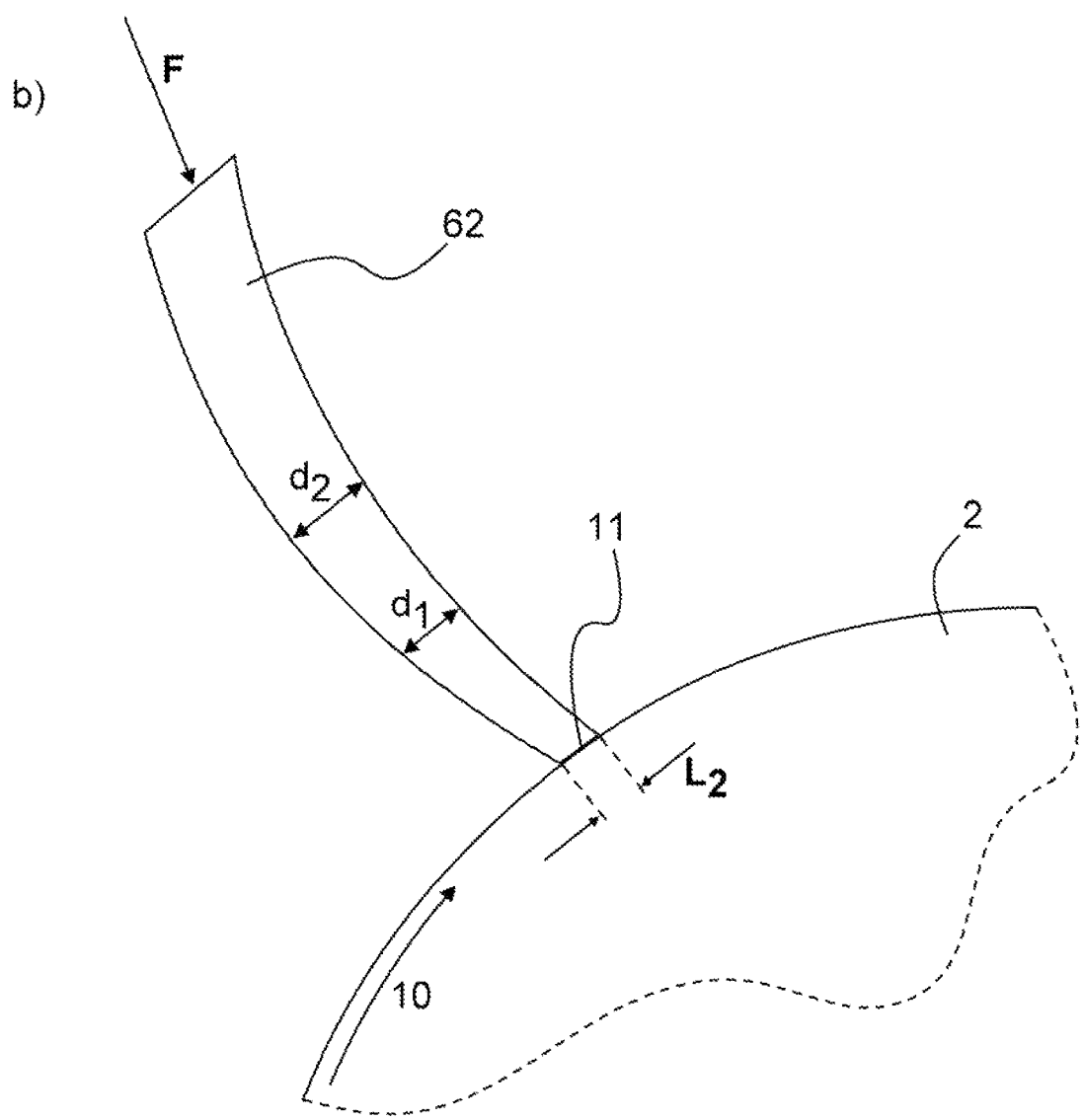

DOCTOR

CROSS REFERENCE TO RELATED APPLICATIONS

This application is a United States National Phase Application of International Application PCT/DE2022/100115, filed Feb. 10, 2022, and claims the benefit of priority under 35 U.S.C. § 119 of German Application 10 2021 103 315.2, filed Feb. 12, 2021, the entire contents of which are incorporated herein by reference.

TECHNICAL FIELD

The present invention relates to a doctor blade, in particular for printing cylinders and coating systems, comprising a doctor blade edge, a doctor blade body, and a curved blade profile that is formed between the doctor blade edge and the doctor blade body.

BACKGROUND

Doctor blades of the type in question are known in particular for intaglio, flexographic, offset and digital printing presses. FIG. 1a shows, by way of example, in order to explain the mode of operation of a doctor blade, a schematic view of a printing mechanism of an intaglio printing press 1. In the intaglio printing method, elements to be imaged are introduced as depressions, known as wells, into the surface of a printing cylinder 2, which rotates within a dye bath 3 and there absorbs ink on the entire surface. By means of a doctor blade device 4 which is arranged downstream in a direction of rotation 10 and has a doctor blade holder 5, a doctor blade 6 held therein, and an (optional) support doctor blade 7, excess ink is scraped or wiped off the surface of the printing cylinder 2, such that the ink remains only in the wells of the printing cylinder 2. The ink remaining in the wells is subsequently transferred onto a paper web 9 which is guided, for this purpose, between the printing cylinder 2 and a counterrotating impression cylinder 8. Viewed in the direction of rotation 10 of the printing cylinder 2, the printing cylinder 2 subsequently absorbs ink in the dye bath 3 again, and a continuous printing process results.

In order to carry out the mentioned printing methods, typically doctor blades are used which are designed as a steel strip that is ground in the manner of a knife. FIG. 1b, c show, by way of example, two different doctor blades that are known according to the prior art, in each case during use as intended and in the unloaded state.

FIG. 1b shows, in partial figure a), a doctor blade 61 in the unloaded state, the blade profile 12 of which, proceeding from the doctor blade edge 11, initially has a linear portion which transitions, via a circular portion of radius R, into the doctor blade body 13. The doctor blade edge 11 is inclined by an angle of approximately 70° relative to the linear upper face of the blade profile 12. During scraping, the doctor blade 61 according to partial figure b) is pressed, by the doctor blade edge 11 thereof, onto the printing cylinder 2 in the force direction F, such that a contact surface of width L1 results. On account of the rotating printing cylinder 2, the doctor blade 61 is deflected, at the doctor blade edge 11 thereof, by an amount in the direction of rotation 10 of the printing cylinder 2, such that a bending stress acts on the doctor blade 61. It has been found in practice that doctor blades 61 of this kind tend, with increasing wear and the resultant increasing bending stress, to rest tangentially on the surface of the printing cylinder 2, as is shown in partial figure c), which results, however, in a comparatively wider contact surface L2 and a reduction in the line pressure with which the doctor blade 61 presses on the printing cylinder 2. As a result, the doctor blade 61 floats at least in part, and the result from the doctor blade is insufficient on account of wear, because residual ink remains, in part, on the printing cylinder 2, even outside of the wells, and thus it is not possible to achieve a perfect result from the doctor blade. The service life of a doctor blade 61 of this kind is therefore limited, as a result of which the doctor blade 61 has to be changed at regular intervals, which is disadvantageously associated with labor-intensive mounting of a new doctor blade 61 and the maintenance-related downtime of the intaglio printing press 1.

FIG. 1c shows, in partial figure a), a doctor blade 62 which has a blade profile 12 having a linear gradient of approximately 2° relative to the doctor blade underside 14, such that the doctor blade thickness d1, d2 increases as the distance from the doctor blade edge 11 increases. During use as intended of a doctor blade 62 of this kind (cf. partial figure b), the doctor blade edge 11 is pressed onto the surface of the printing cylinder 2. As the wear increases, the specific line pressure decreases on account of the increasing contact surface, as a result of which, in the case of this doctor blade geometry too, the result from the doctor blade is unsatisfactory on account of wear, and the doctor blade 62 has to be changed in order to still achieve a perfect result from the doctor blade. The disadvantages discussed above, with regard to the maintenance work required due to wear, result in the case of the doctor blade 62 according to FIG. 1c, too.

Doctor blades of the type in question are furthermore used in coating systems, in order, for example, to apply hot or cold seal adhesives in thin layers to paper, cardboard packaging, or films.

SUMMARY

Proceeding herefrom, the object of the present invention is that of providing a doctor blade which reduces the maintenance outlay for an intaglio printing press, flexographic printing press, offset printing press, digital printing press, and/or a coating system, and increases the service life of a doctor blade.

This object is achieved by the doctor blade according to the invention. According to the invention, it is first provided that the curved blade profile has a cuboidal course from the doctor blade edge to the doctor blade body. In particular, this is intended to mean a course in which the thickness of the doctor blade increases in a cuboidal manner from the doctor blade edge to the doctor blade body. Due to this special doctor blade geometry, in particular in the region of the curved blade profile, a substantially constant line pressure which is independent of wear is achieved, because the change in the bending of the blade profile and the associated change in the bending stress compensates the change in the contact surface between the doctor blade and the printing cylinders, and thus the doctor blade edge. This leads to a constant and perfect result from the doctor blade, which is as far as possible independent of the wear of the doctor blade, which is directly apparent from a reduced maintenance outlay for a printing machine and a longer service life of a doctor blade of this kind.

Alternatively, and/or in addition it is provided according to the invention that the curved blade profile has a cuboidal course from the doctor blade edge to the doctor blade body which has at least one turning point. In this case, the turning point can coincide with a point of the course at which the course has a positive or a negative gradient, or at which the gradient disappears, such that the turning point simultaneously forms a saddle point. In particular a region having a (slightly) falling gradient between the turning point and the doctor blade edge, and thus having a (slight) thickness increase in the curved blade profile results in a reduced warm-up time, i.e. the time in which the contact with the printing cylinder transitions from punctual to areal resting, on account of the wear.

Preferred embodiments of the present invention are specified below and in the dependent claims.

Within the context of a first advantageous embodiment of the present invention, it is provided that the following applies for the course f(x) of the curved blade profile, from the doctor blade edge to the doctor blade body, of the doctor blade having a thickness s at the doctor blade edge and a thickness t at the doctor blade body:

$$f(x)=ax^3=bx^2+cx+d.$$

In this case, within the context of a first preferred embodiment the following applies for the constants a, b, c, d:

a>0 (b and c)≥0, (a or b)>0 and d=s−t.

In other words, the constant a is greater than zero and the constants b and c are in each case greater than or equal to zero. In this respect, the course f(x) of the curved blade profile has at least one portion, between the doctor blade edge and the doctor blade body, which increases in a square or cuboidal manner. In this case, here and in the following the functionally represented course f(x) of the curved blade profile relates to a doctor blade, the doctor blade edge of which, at the transition to the ground region of the blade profile, is located on the y-axis of a cartesian coordinate system, and the doctor blade upper side of which coincides with the x-axis of the coordinate system.

Alternatively, the following applies for the constants a, b, c and d:

(a and c)>0, b<0 and d=s−t.

On account of the negative constant b, the turning point of the course f(x) shifts into the positive half plane (x>0), and thus into the region between the doctor blade edge and the doctor blade body. This results in the advantages of the curved blade profile already mentioned above.

The above-described range limits for the constants a, b, c and d lead, depending on magnitude, to different courses of the curved blade profile, which will be discussed in the following only by way of example.

For
a>0, b=0, c=0 and d=s−t, or
a>0, b>0, c=0 and d=s−t
a course of the curved blade profile that rises in a cuboidal manner results, wherein the gradient vanishes at the doctor blade edge. In other words, the blade profile is oriented in parallel with the doctor blade underside, in the region of the doctor blade edge, and a grinding angle at the doctor blade edge of 0° results.

For
a>0, b=0, c>0 and d=s−t, or
a>0, b>0, c>0 and d=s−t
a course of the curved blade profile that rises in a cuboidal manner results, having a positive gradient at the doctor blade edge. In this case, the grinding angle at the doctor blade edge is >0°.

For a=0, b>0, c=0 and d=s−t, a course of the curved blade profile that rises in a square manner, having a vanishing gradient at the doctor blade edge results, due to which the grinding angle in the region of the doctor blade edge is 0° within the context of this embodiment too.

If the following are selected for the constants a=0, b>0, c=0 and d=s−t, a course of the curved blade profile that rises in a square manner, having a positive grinding angle at the doctor blade edge, results.

In the following, in each case embodiments having specific range information for the constants a, b and c are described.

Within the context of a preferred embodiment of the present invention, in the case of a cuboidal course f(x) of the curved blade profile, the following is provided for the constants a, b, and c:

0.000485≤a≤0.0021953,
3.33158≤b≤4.545127, and
1.468371≤c≤25.0128.

In the case of a cuboidal course f(x) of the curved blade profile, the following preferably applies for the constants a, b, and c:

0.00068≤a≤0.00158,
3.3321≤b≤4.5416, and
10.19478≤c≤10.2501.

In the case of a square course f(x) of the curved blade profile, within the context of an advantageous embodiment the following applies for the constants a, b, and c:

a=0,
3.335997≤b≤4.565214, and
1.457449≤c≤25.96338.

Within the context of a particularly preferred embodiment of the invention, in the case of a square course f(x) of the curved blade profile, the following is provided for the constants a, b, and c:

a=0,
3.33829≤b≤4.55603, and
10.017947≤c≤10.21459.

Within the context of the preferred embodiments of the curved blade profile discussed above, in each case only the constants a, b and c are discussed, which describe the change of the thickness of the curved blade profile from the doctor blade edge to the doctor blade body. The thicknesses s, t of the doctor blade both at the doctor blade edge and at the doctor blade body can be selected depending on the application, wherein preferably the following applies for the constants s, t:

60 µm≤s≤125 µm and
150 µm≤t≤200 µm.

In all cases, the doctor blade is preferably manufactured from a ground steel strip. Alternatively, the doctor blade can consist of a different metal, a metal alloy, aluminum or of plastics material, such as polyester.

Specific embodiments of the doctor blade according to the invention are explained in the following with reference to FIGS. 2a to 5. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIG. 1a is a schematic view of a state of the art printing mechanism of an intaglio printing press showing a mode of operation of a doctor blade;

FIG. 1b includes schematic views a), b) and c) showing states of a state of the art doctor blade;

FIG. 1c includes schematic view a) showing a state of the art doctor blade and view b) showing the same doctor blade with an edge pressed onto the surface of the printing cylinder;

FIG. 2b is a plan view of the doctor blade of FIG. 2a;

FIG. 2c is a cross-sectional view of the doctor blade of FIG. 2a;

DESCRIPTION OF PREFERRED EMBODIMENTS

Figure 2A:
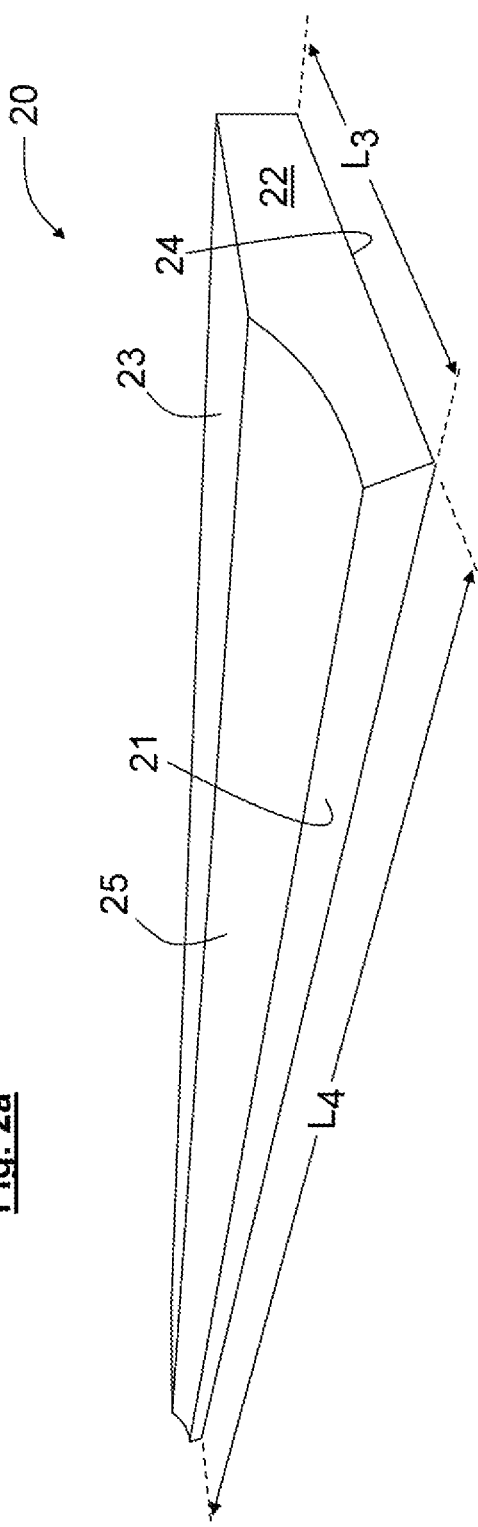
FIG. 2a is a perspective view of a doctor blade according to the invention.

Referring to the drawings, FIG. 2a is a perspective view of a specific embodiment of a doctor blade 20. The doctor blade 20 consists of a ground steel strip and has a doctor blade edge 21 which is inclined by approximately 70° with respect to a horizontal and is designed to rest on a rotating printing cylinder (not shown). Alternatively to an inclination of the doctor blade edge of approximately 70°, the doctor blade edge can also be curved. In this connection, a concave curved shape, in particular having a constant radius of curvature, has proven particularly advantageous. However, for the sake of simplicity, here and in the drawings a doctor blade edge 21 having an inclination relative to the horizontal is always shown. For detachably fastening the doctor blade 20 to a holder (not shown), the doctor blade 20 has a doctor blade body 22, on the side opposite the doctor blade edge 21, which body is delimited by two flat surfaces, specifically the doctor blade upper side 23 and the doctor blade underside 24. A curved blade profile 25 which has a square or cuboidal course extends between the doctor blade edge 21 and the doctor blade body 22. Doctor blades 20 of this kind typically have a length $L_3$ of 20 mm to 60 mm and are wound onto transportable coils of up to 100 m. In the state when cut to length, and thus mountable, doctor blades 20 of this kind typically, depending on the application, have a width $L_4$ of 80 mm to 4000 mm.

Figure 2B:
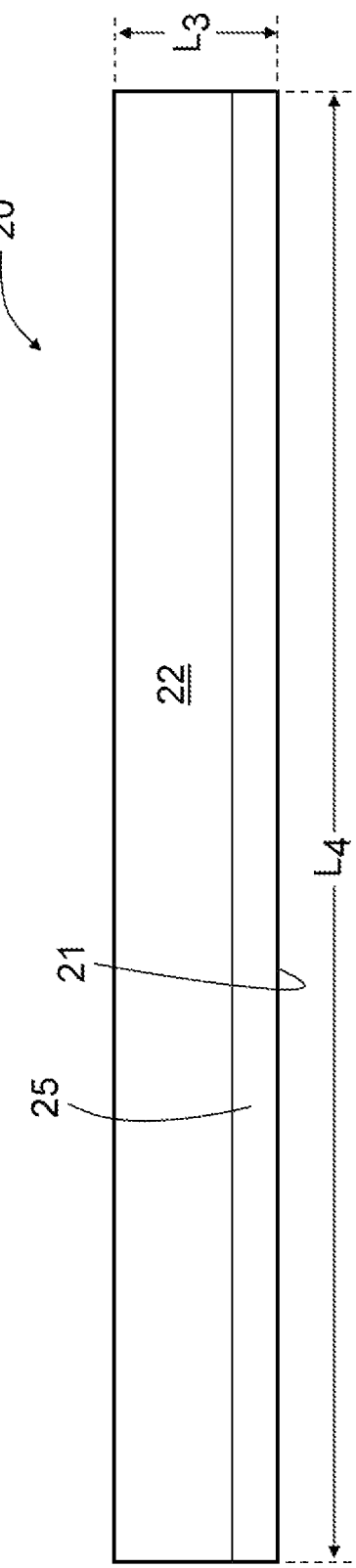

FIG. 2b is a plan view of a doctor blade 20 of this kind, comprising the doctor blade edge 21, the curved blade profile 25 and the doctor blade body 22.

Figure 2C:
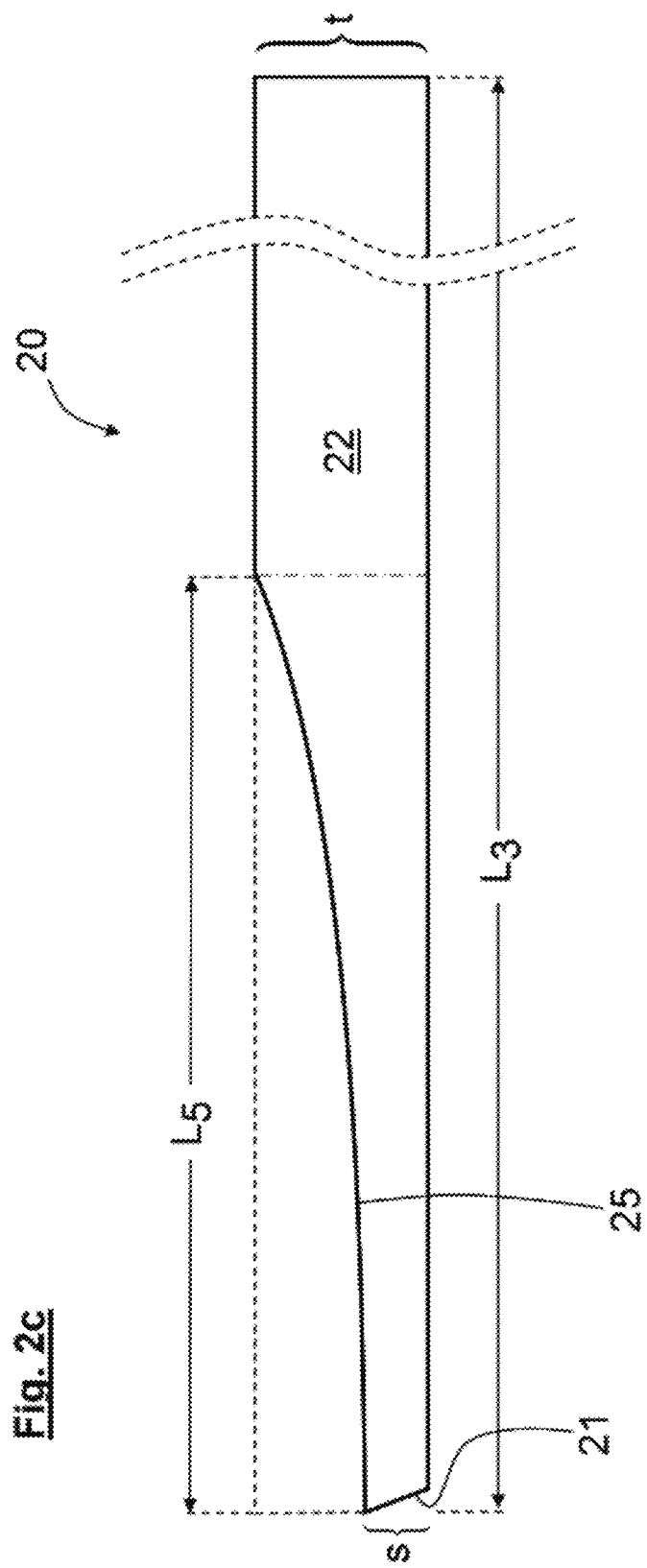

FIG. 2c is a cross-sectional view of the doctor blade 20 which has the thickness s at its doctor blade edge 21 and the thickness t in the region of the doctor blade body 22. The curved blade profile 25 of length $L_5$, which, in the embodiment of the present embodiment that is shown, has either a square or a cuboidal course, extends between the doctor blade edge 21 and the doctor blade body 22.

Figure 3A:
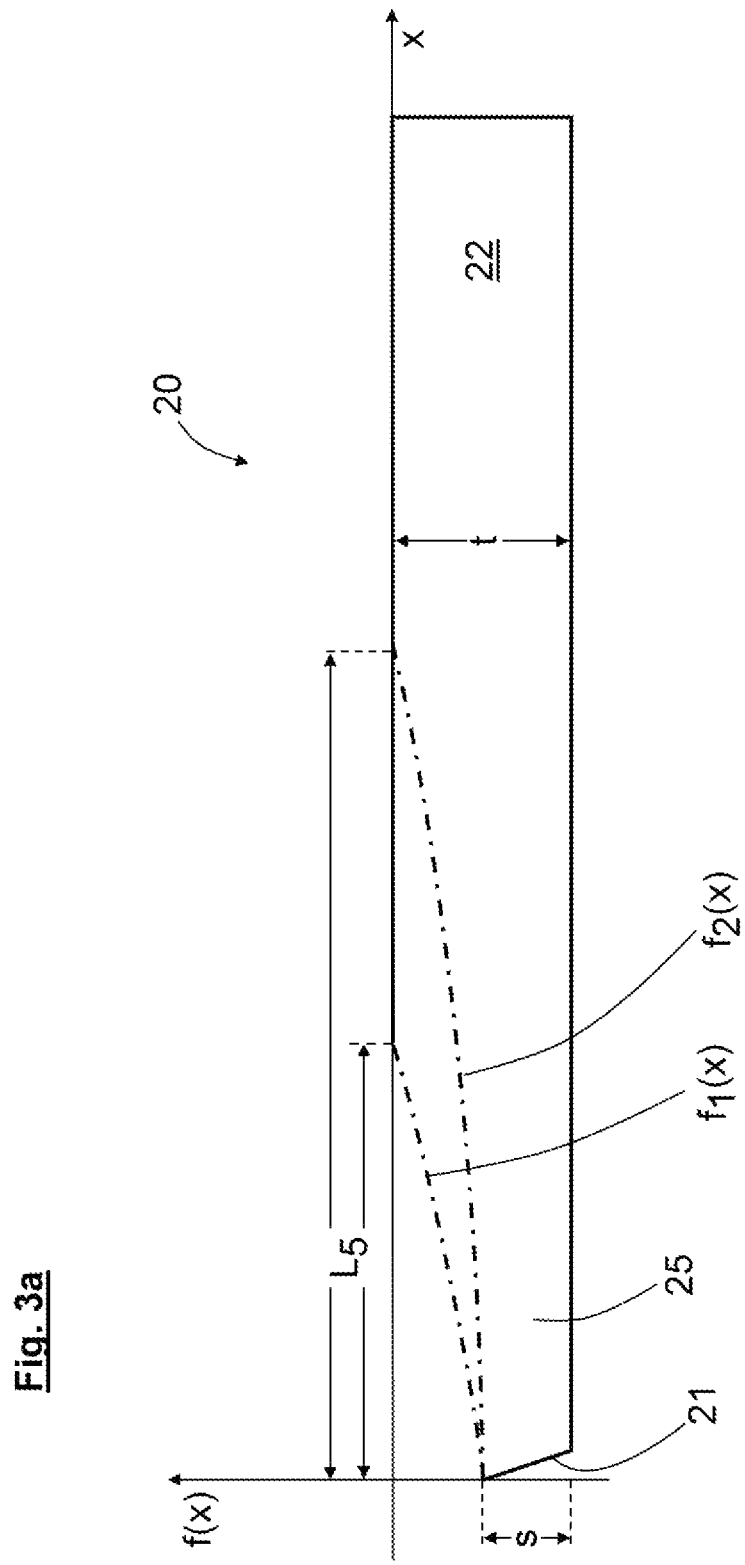
FIG. 3a and FIG. 3b are views in each case showing a doctor blade having a square course of the curved blade profile according to the invention.

The region limits for the constants a, b, c and d lead, both within the context of the square course and within the context of the cuboidal course of the curved blade profile 25, to the possible courses forming a family of curves, wherein the family of curves is limited by a first curve having the smallest possible values in each case for the constants a, b and c, and a second curve having the largest possible values in each case for the constants a, b and c. The constant d merely brings about a shift of the y-axis portion, and is dependent on the thickness s of the doctor blade 20 at the doctor blade edge 21 thereof, and the thickness t of the doctor blade 20 at the doctor blade body 22 thereof, which can be selected depending on the requirements. In each case, a specific embodiment of the square and cuboidal course of the doctor blade 20 are shown in FIGS. 3a, b and 4a, b, wherein FIG. 3a, b show a square course f(x) and FIG. 4a, b show a cuboidal course f(s) of the curved blade profile 25. In all the embodiments show, for the sake of simplicity uniform thicknesses s, t of the doctor blade 20 at its doctor blade edge 21 and its doctor blade body 22 are assumed. Furthermore, the course f(x) of the curved blade profile 25, represented functionally in each case, relates to a doctor blade 20, the doctor blade edge 21 of which, at the transition to the ground region of the blade profile 25, is located on the y-axis of a cartesian coordinate system, and the doctor blade upper side 23 of which coincides with the x-axis of the coordinate system.

Proceeding herefrom, FIG. 3a shows two mutually spaced course f(x), shown in dashed lines, which represent the outer limit regions of the constants a, b and c. According thereto, $f_1(x)$ represents the square course f(x) of the curved blade profile 25, for which the following applies: a=0, b=4.565214, c=25.96338, s=70 μm a=and t=200 μm.

$f_2(x)$ represents the square course f(x) of the curved blade profile 25, for which the following applies:

a=0, b=3.335997, c=1.457449, s=70 μm and t=200 μm.

Figure 3B:
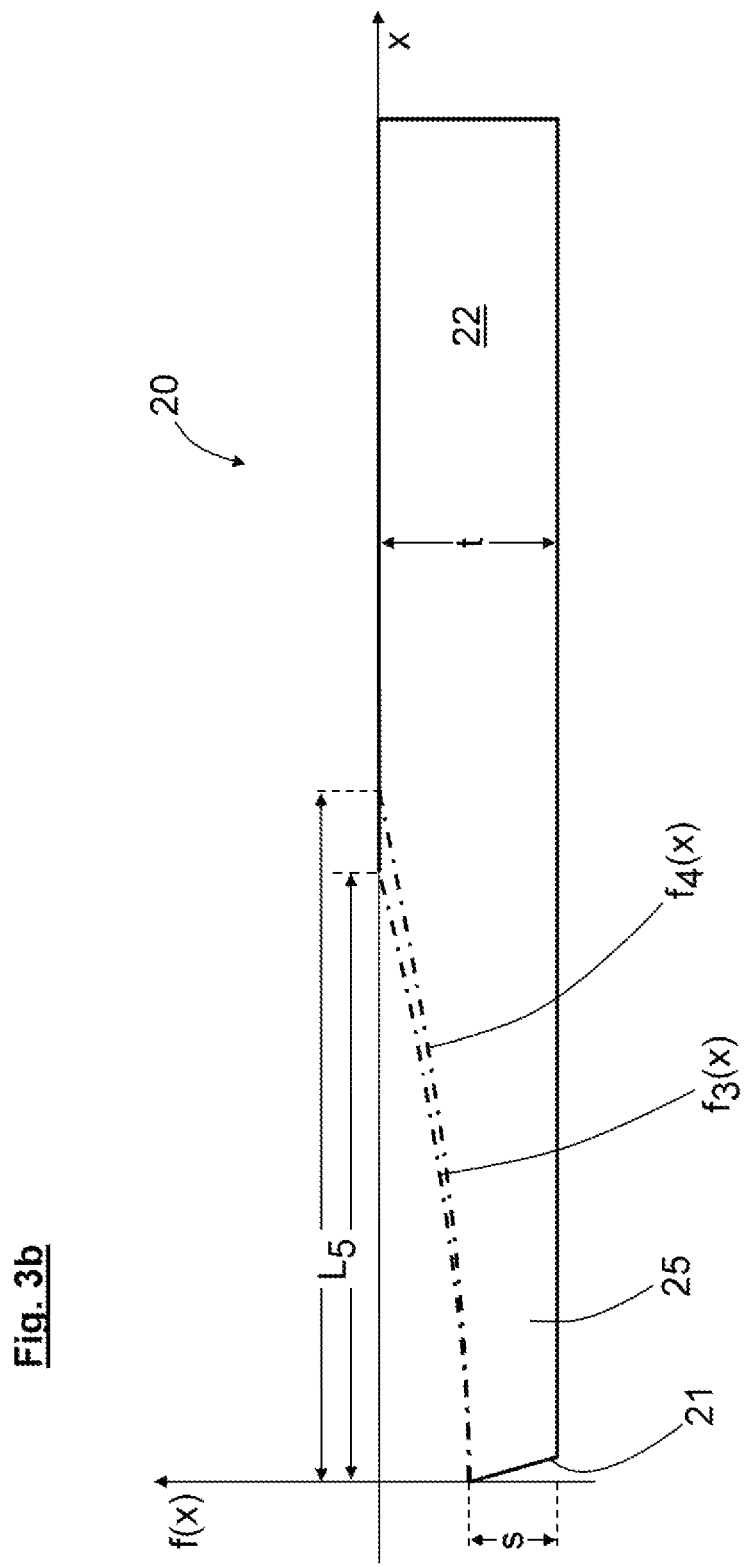

FIG. 3b shows a particularly preferred partial range of the values for the constants a, b, c, s and t within the context of a square course f(x) of the curved blade profile 25. According thereto, $f_3(x)$ represents the square course f(x) of the curved blade profile 25, for which the following applies:

a=0, b=4.55603, c=10.21459, s=70 μm and t=200 μm.

Within the context of the preferred embodiment, $f_4(x)$ represents the square course f(x) of the curved blade profile 25, for which the following applies:

a=0, b=3.33829, c=10.017947, s=70 μm and t=200 μm.

Figure 4A:
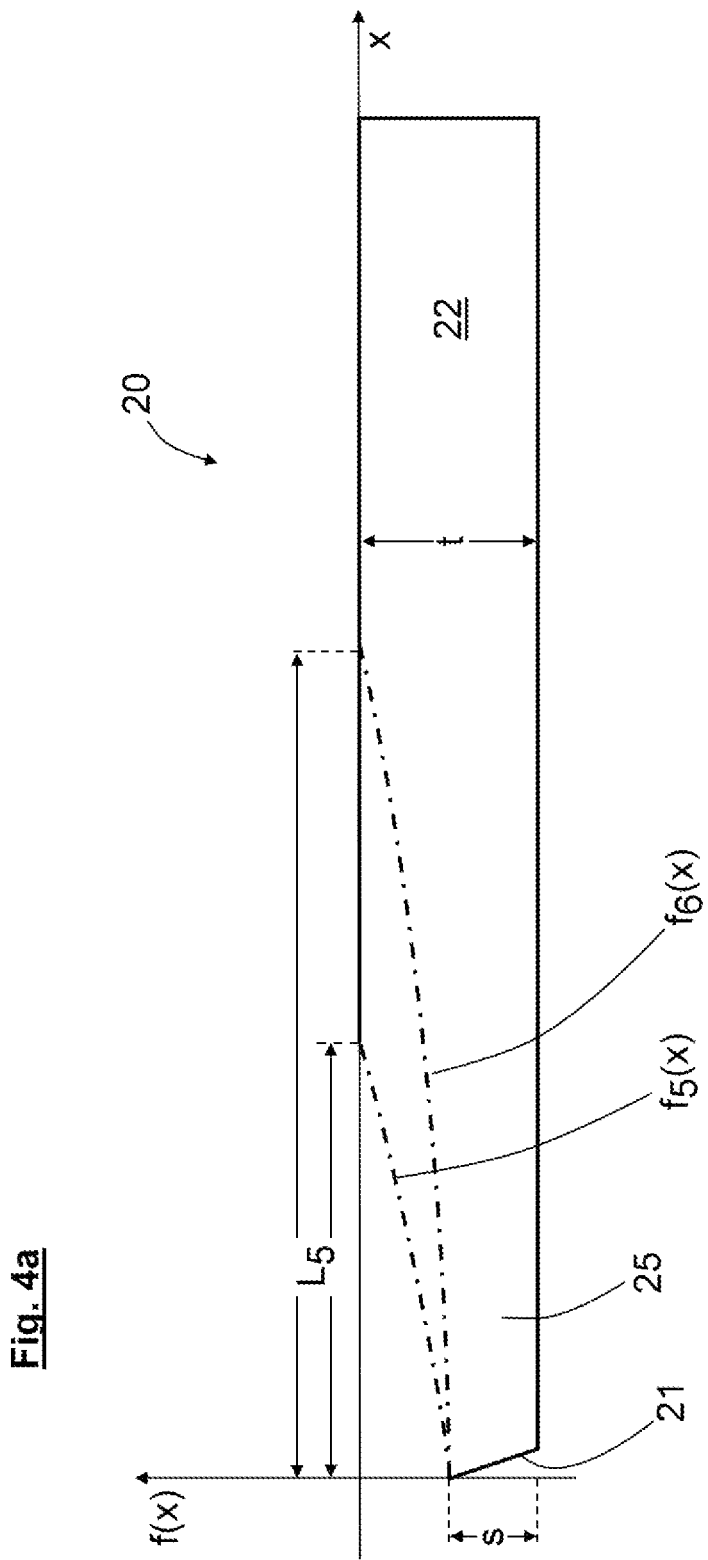
FIG. 4a and FIG. 4b are views in each case showing a doctor blade having a cubodial course of the curved blade profile.

In a similar manner, FIG. 4a, b show a specific embodiment of a doctor blade 20, in the case of which a cuboidal course of the curved blade profile 25 is provided. Specifically, FIG. 4a, b in each case show two mutually spaced courses f(x), shown in dashed lines, which represent the outer limit regions of the constants a, b and c. According thereto, $f_5(x)$ represents the cuboidal course f (x) of the curved blade profile 25, for which the following applies:

a=0.0021953, b=4.545127, c=25.0128, s=70 μm and t=200 μm.

$f_6(x)$ represents the cuboidal course f(x) of the curved blade profile 25, for which the following applies:

a=0.000485, b=3.33158, c=1.468371, s=70 μm and t=200 μm.

Figure 4B:
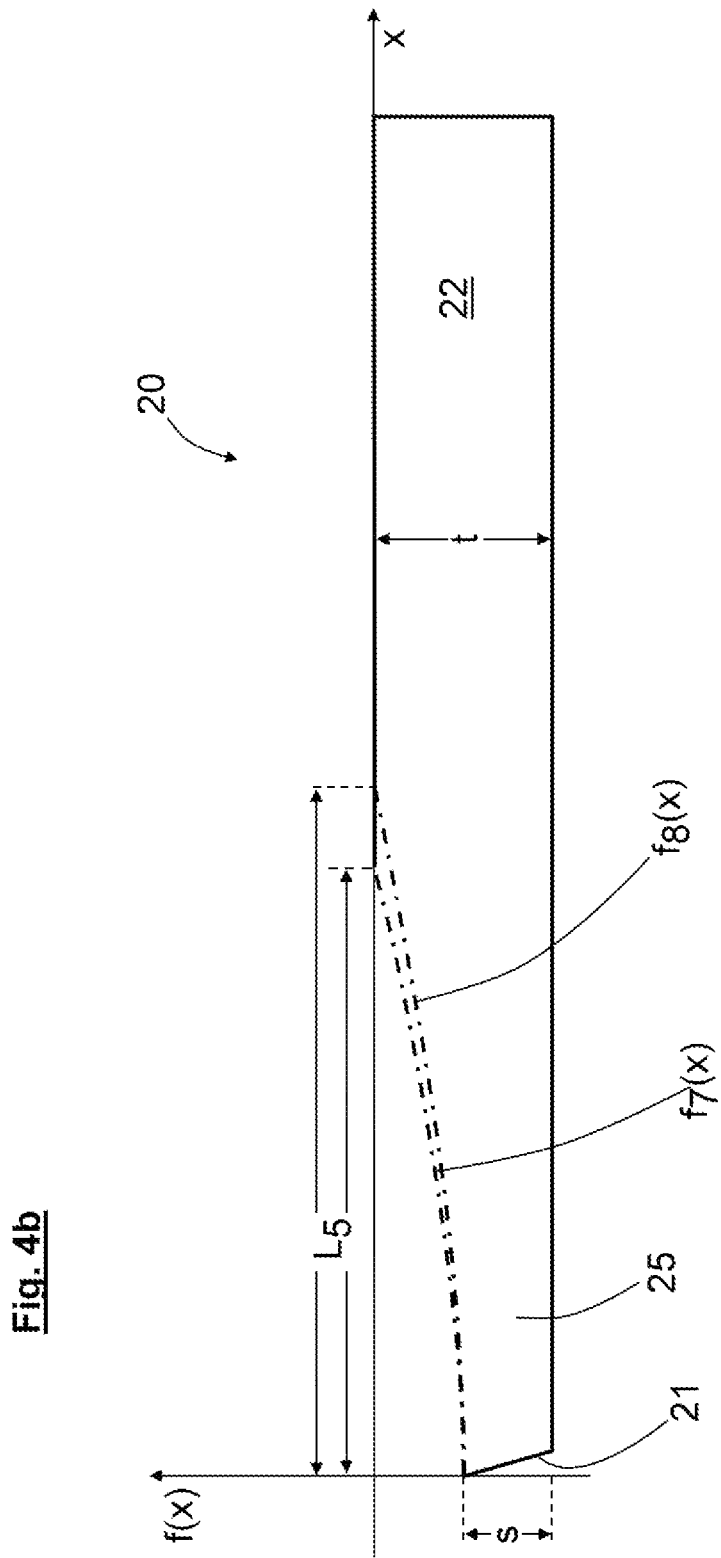

FIG. 4b shows a particularly preferred partial range of the values for the constants a, b, c, s and t within the context of a cuboidal course f(x) of the curved blade profile 25. According thereto, $f_7(x)$ represents the cuboidal course f(x) of the curved blade profile 25, for which the following applies:

a=0.00158, b=4.5416, c=10.2501, s=70 μm and t=200 μm.

Within the context of the preferred embodiment, $f_8(x)$ represents the cuboidal course f(x) of the curved blade profile 25, for which the following applies:

a=0.00068, b=3.3321, c=10.19478, s=70 μm and t=200 μm.

Within the context of specific embodiments of the present invention, variations of the thickness s of the doctor blade 20 at the doctor blade edge 21 and the thickness t of the doctor blade 20 at the doctor blade body 22 are provided in such a way that 60 μm≤s≤125 μm and 150 μm≤t≤200 μm applies.

Proceeding herefrom, curved blade profiles 25 having a square or cuboidal course f(x) result, wherein lengths $L_5$ of the blade profile 25 between 0.8 mm and 4.9 mm can be specified.

Figure 5:
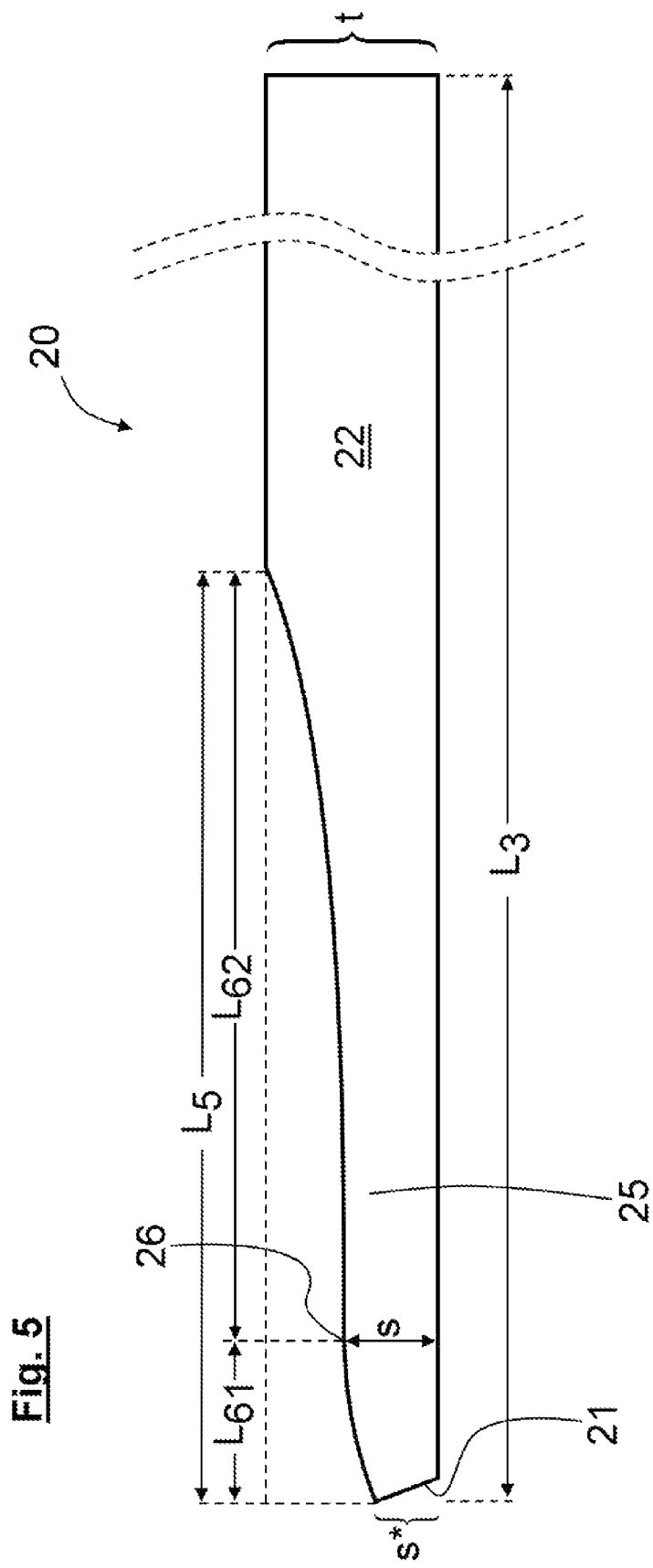
FIG. 5 shows a doctor blade having a curved blade profile which has a turning point.

Finally, FIG. 5 shows a doctor blade 20 having a curved blade profile 25 between the doctor blade edge 21 and the doctor blade body 22, wherein the course f(x) has a turning point 26. The turning point 26 is the intersection point of a first region $L_{61}$ and a second region $L_{62}$ of the curved blade profile 25, wherein the first region $L_{61}$ has a right-hand curvature, proceeding from the doctor blade edge 21, and the second region $L_{62}$ has a left-hand curvature. In other words, a tangent applies to the curved blade profile 25 changes sides at the turning point 26. In the embodiment shown, the gradient of the curved blade profile 25 vanishes at the turning point 26, such that the turning point 26 coincides with a saddle point. Specifically, the following applies at the turning point 26: f'(x)=f''(x)=0. Alternatively thereto, embodiments (not shown) are also provided in which the course f(x) of the curved blade profile 25 has a positive gradient at the turning point 26.

The region $L_{62}$, i.e. the region between the turning point 26 and the doctor blade body 22, has a course f(x), as has been described above in connection with a doctor blade 20, which has a square or cuboidal course f(x). However, the course f(x) is shifted in the positive x-direction by the length of the region $L_{61}$. Therefore, at the turning point 26 the doctor blade 20 has a thickness s. In this case, the turning point 26 is located within the front half of the blade profile, as a result of which the following applies: $L_{61} \geq L_{62}$. As a result, a doctor blade 20 having a turning point 26 has a doctor blade edge having a comparatively small thickness s*. Specifically, the following applies for s*: 40 µm≤ s*≤s.

The course f*(x) in the region $L_{61}$ follows a cuboidal shape or a square shape that is open at the bottom. In the case of a cuboidal shape, the course f*(x) can be described generally by:

$$f^*(x)=a^*x^3+b^*x^3+c^*x-s^*-t.$$

In this case, the following applies:
a*>a, b*≤0, 0<c* ≤100, 150µm≤t≤200µm and 40 µm≤s*<s. In the case of a shape that is open at the bottom, the course f* (x) can be described generally by: $f^*(x)=a^*x^3+b^*x^3+c^*x+s^*-t$.

In this case, the following applies:
a*=0, b*<0, 0<c*≤100, 150 µm≤t≤200 µm and 40 µm≤s*<s.

While specific embodiments of the invention have been shown and described in detail to illustrate the application of the principles of the invention, it will be understood that the invention may be embodied otherwise without departing from such principles.

REFERENCE CHARACTERS 1 intaglio printing press
2 printing cylinder
3 dye bath
4 doctor blade device
5 doctor blade holder
6 doctor blade (prior art)
61 doctor blade (prior art)
62 doctor blade (prior art)
7 support doctor blade
8 impression cylinder
9 paper web
10 direction of rotation
11 doctor blade edge
12 blade profile
13 doctor blade body
14 doctor blade underside
20 doctor blade
21 doctor blade edge
22 doctor blade body
23 doctor blade upper side
24 doctor blade underside
25 blade profile
26 turning point
a, a* constant
b, b* constant
c, c* constant
d constant
F force direction
s, s* thickness of the doctor blade at the doctor blade edge
t thickness of the doctor blade at the doctor blade body
$d_{1,2}$ thickness of the doctor blade in the region of the blade profile
R radius
$L_{1,2}$ width of the contact surface
$L_3$ doctor blade length
$L_4$ doctor blade width
$L_5$ length of the blade profile
$L_{61}$ region of the blade profile having a right-hand curvature
$L_{62}$ region of the blade profile having a left-hand curvature
f(x), f*(x) course of the blade profile

The invention claimed is:

1. A doctor blade comprising:
a doctor blade edge;
a doctor blade body having a doctor blade upper side and a doctor blade underside; and
a curved blade profile which is formed between the doctor blade edge and the doctor blade body, wherein in an unloaded state of the doctor blade and in relation to a Cartesian coordinate system the curved blade profile has cuboidal course f(x) from the doctor blade edge to the doctor blade body, wherein the x-axis of the Cartesian coordinate system coincides with and is parallel to the doctor blade body upper side the y-axis of the Cartesian coordinate system is perpendicular to the x-axis which intersects a most distal portion of the doctor blade edge, wherein the course f(x) of the curved blade profile, from the doctor blade edge to the doctor blade body, of the doctor blade having a thickness s at the doctor blade edge and a thickness t at the doctor blade body:

$$f(x)=ax^3+bx^2+cx+d,$$

and wherein the following applies for the constants a, b, c, d:
a) a>0, (b and c) ≥0 and d=s–t, or
b) (a and c)>0, b<0 and d=s–t, and wherein, for the cuboidal course f(x) of the curved blade profile, the following applies for the constants a, b, and c:
0.000485≤a≤0.0021953,
3.33158≤b≤4.545127, and
1.468371≤c≤25.0128.

2. A doctor blade according to claim 1, wherein the following applies for the thickness s of the doctor blade at the doctor blade edge and the thickness t of the doctor blade at the doctor blade body:
60 µm≤s≤125 µm and
150 µm ≤t≤200 µm.

3. A doctor blade according to claim 1, the doctor blade is manufactured from a ground steel strip.

4. A doctor blade according to claim 1, wherein the curved blade profile has a course f(x), from the doctor blade edge to the doctor blade body, having at least one turning point.

5. A doctor blade comprising a doctor blade body:
   a doctor blade edge surface with a doctor blade edge;
   a doctor blade body delimited by a flat surface upper side and a flat surface underside and configured for detachable fastening to a holder and
   a curved blade profile portion extending form the doctor blade edge to the upper side of the doctor blade body, wherein in an unloaded state of the doctor blade, the curved blade profile has, in relation to a Cartesian coordinate system with x-axis of the Cartesian coordinate system coincides with and is parallel to the doctor blade flat surface upper side and the y-axis of the Cartesian coordinate system is perpendicular to the x-axis which intersects a most distal portion of the doctor blade edge, a cuboidal course f(x) wherein the following applies for the course f(x) of the curved blade profile, from the doctor blade edge to the doctor blade upper side, of the doctor blade having an edge surface thickness and a thickness t from the doctor blade upper side to the doctor blade underside:

$$f(x)=ax^3+bx^2+cx+d,$$

wherein for a, b, c, d: a>0, b>0, c≥0 and d=s−t, or wherein for a, b, c, d: a>0, c>0, b<0 and d=s−t and wherein, for the cuboidal course f(x) of the curved blade profile, the following applies for the constants a, b, and c:
0.000485≤a≤0.0021953,
3.33158≤b≤4.545127, and
1.468371≤c≤25.0128.

6. A doctor blade according to claim 5, wherein, for the cuboidal course f(x) of the curved blade profile, the following applies for the constants a, b, and c:
0.00068≤a≤0.00158,
3.3321≤b≤4.5416, and
10.19478≤c≤10.2501.

7. A doctor blade according to claim 5, the doctor blade is manufactured from a ground steel strip.

8. A doctor blade according to claim 5, wherein the curved blade profile has a course f(x), from the doctor blade edge to the doctor blade upper side, having at least one turning point.

9. A doctor blade comprising:
   a doctor blade edge;
   a doctor blade body having a doctor blade upper side and a doctor blade underside; and
   a curved blade profile which is formed between the doctor blade edge and the doctor blade body, wherein in an unloaded state of the doctor blade and in relation to a Cartesian coordinate system the curved blade profile has cuboidal course f(x) from the doctor blade edge to the doctor blade body, wherein the x-axis of the Cartesian coordinate system coincides with and is parallel to the doctor blade body upper side the y-axis of the Cartesian coordinate system is perpendicular to the x-axis which intersects a most distal portion of the doctor blade edge, wherein the course f(x) of the curved blade profile, from the doctor blade edge to the doctor blade body, of the doctor blade having a thickness s at the doctor blade edge and a thickness t at the doctor blade body:

$$f(x)=ax^3+bx^2+cx+d,$$

and wherein the following applies for the constants a, b, c, d:
a) a>0, (b and c)≥0 and d=s−t, or
b) (a and c)>0, b<0 and d=s−t, and wherein, for the cuboidal course f(x) of the curved blade profile, the following applies for the constants a, b, and c:
0.00068≤a≤0.00158,
3.3321≤b≤4.5416, and
10.19478≤c≤10.2501.

10. A doctor blade comprising a doctor blade body:
   a doctor blade edge surface with a doctor blade edge;
   a doctor blade body delimited by a flat surface upper side and a flat surface underside and configured for detachable fastening to a holder and
   a curved blade profile portion extending form the doctor blade edge to the upper side of the doctor blade body, wherein in an unloaded state of the doctor blade, the curved blade profile has, in relation to a Cartesian coordinate system with x-axis of the Cartesian coordinate system coincides with and is parallel to the doctor blade flat surface upper side and the y-axis of the Cartesian coordinate system is perpendicular to the x-axis which intersects a most distal portion of the doctor blade edge, a cuboidal course f(x) wherein the following applies for the course f(x) of the curved blade profile, from the doctor blade edge to the doctor blade upper side, of the doctor blade having an edge surface thickness and a thickness t from the doctor blade upper side to the doctor blade underside:

$$f(x)=ax^3+bx^2+cx+d,$$

wherein for a, b, c, d: a>0, b≥0, c≥0 and d=s−t, or
wherein for a, b, c, d: a>0, c>0, b<0 and d=s−t and wherein the following applies for the thickness s of the doctor blade at the doctor blade edge and the thickness t of the doctor blade at the doctor blade upper side:
60 µm≤s≤125 µm and
150 µm≤t ≤200 µm.

* * * * *

UNITED STATES PATENT AND TRADEMARK OFFICE
CERTIFICATE OF CORRECTION

PATENT NO. : 12,420,542 B2  
APPLICATION NO. : 18/035128  
DATED : September 23, 2025  
INVENTOR(S) : Sauder et al.

Page 1 of 1

It is certified that error appears in the above-identified patent and that said Letters Patent is hereby corrected as shown below:

In the Specification

Column 3, Line 18 should read: $f(x)=ax^3+bx^2+cx+d$

Column 3, Line 22 should read: $a>0$, (b and c)=0

Column 7, Lines 38 should read: $f^*(x)=a^*x^3+b^*x^2+c^*x-s-t$

Column 7, Lines 44 should read: $f^*(x)=a^*x^3+b^*x^2+c^*x-s-t$

Signed and Sealed this  
Twenty-third Day of December, 2025

John A. Squires  
*Director of the United States Patent and Trademark Office*